United States Patent [19]
Jo et al.

[11] Patent Number: 5,859,452
[45] Date of Patent: Jan. 12, 1999

[54] MEMORY CELL ARRAY HAVING IMPROVED CHANNEL CHARACTERISTICS

[75] Inventors: Kwang Hyun Jo, Kyungki-Do; Sheung Hee Park, Seoul, both of Rep. of Korea

[73] Assignee: Hyundai Electronics Industries Co., Ltd., Kyungki-Do, Rep. of Korea

[21] Appl. No.: 807,288

[22] Filed: Feb. 27, 1997

[30] Foreign Application Priority Data

Feb. 27, 1996 [KR] Rep. of Korea ............... 1996 4776

[51] Int. Cl.⁶ .................... H01L 29/76; H01L 29/788
[52] U.S. Cl. ................ 257/314; 257/506; 438/257
[58] Field of Search .......................... 257/314, 315, 257/506; 438/257, 262

[56] References Cited

U.S. PATENT DOCUMENTS

| | | | |
|---|---|---|---|
| 4,918,501 | 4/1990 | Komori et al. | 257/315 |
| 5,293,331 | 3/1994 | Hart et al. | 365/185 |
| 5,559,735 | 9/1996 | Takashi Ono Masami Ikegami | 365/185 |

*Primary Examiner*—Olik Chaudhuri
*Assistant Examiner*—Howard Weiss
*Attorney, Agent, or Firm*—Scott C. Harris, Esq.

[57] ABSTRACT

A memory cell array with an active region which has first portions and fifth portions which are at both ends thereof and a third portion which is the middle portion thereof. The first, third and fifth portions are parallel to each other with a certain spacing. The first and third portions are interconnected by a second portion sloped toward a side of the third portion. The third portion and fifth portions are interconnected by a fourth portion sloped upward from the other side of the third portion. Source regions are formed in the first and fifth portions and fifth portion of the active region. A drain region is formed in the third portion of the active region. Channel regions are formed in the second portion and fourth portion of the active region. Floating gates are disposed over each of the channel regions. A pair of control gates is disposed over the floating gates.

1 Claim, 3 Drawing Sheets

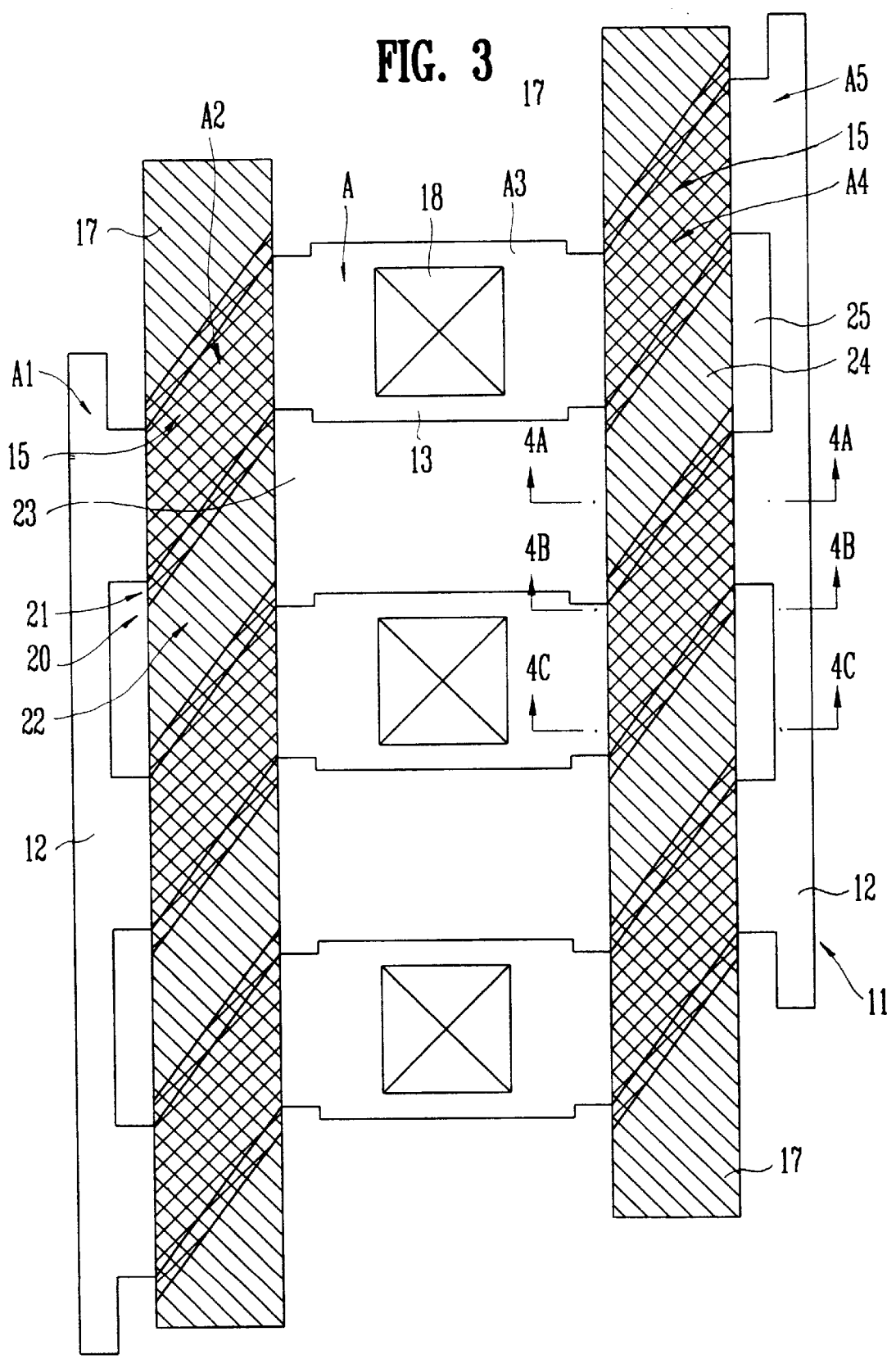

MEMORY CELL ARRAY HAVING IMPROVED CHANNEL CHARACTERISTICS

BACKGROUND OF INVENTION

1. Field of the invention

The present invention relates to a memory cell array which can improve a program efficiency.

2. Brief Description of the Prior Art

In general, a non-volatile memory device having functions of electrical program and erasure is composed of a memory cell array and a peripheral circuit. The memory cell array consists of a plurality of memory cells, each of the memory cells is selected by word line and bit line signals. And an information is stored to the memory cell. The program operation for storing an information to each memory cell is performed by injection of a hot carrier to a floating gate, and erasing operation is performed by discharge of the injected hot carrier due to tunnelling. Therefore, the degree of generation of hot carriers is an important factor for decision of program efficiency of the memory cell.

In addition, the memory cell has a gate electrode of a stack or split structure. Now, a conventional memory cell array composed of memory cells having a gate electrode of the stack structure is described below with reference to FIGS. 1 and 2.

FIG. 1 is a lay-out to illustrate the conventional memory cell array. Field oxide films 9 are formed in isolation regions, respectively, of a silicon substrate 1, and control gates 7 are formed on the substrate 1 in right angle with the field oxide films 9. A plurality of floating gates 5 including a portion of the field oxide film 9 are formed below each control gate 7. Drain regions 3 are formed in active regions A1 corresponding to the inside of each control gate 7, and source regions 2 are formed in active regions A2 corresponding to the outside of each control gate 7. In addition, contact portions 8 for contact with a bit line which is extended to cross the control gates 7 are formed in the drain regions 3, respectively.

FIG. 2 is a cross sectional view taken along a line 2A—2A and shows a non-volatile memory cell having a stack structure as described above. In the non-volatile memory cell, a gate electrode 10 composed by sequentially forming a tunnel oxide film 4, the floating gate 5, a dielectric film 6 and the control gate 7 is formed on a channel region of the silicon substrate 1. The source and drain regions 2 and 3 are formed at both sides of the gate electrode 10.

The program operation of the memory cell array constructed as described above is described below.

If program bias voltages are applied to the control gate 7, drain region 3 and source region 2 of memory cell to be programmed, respectively, a horizontal electric field is formed in the silicon substrate 1. At this time, a channel pinch-off region is formed at the edge of the drain region 3, therefore, the strength of an electric field is maximized at the periphery of the drain region 3. In this condition, in the process where electrons move from the source region 2 along a channel formed at the space of the silicon substrate 1, the electrons pass through a high electric field around the drain region 3 to be accelerated and obtain substantial energy. Such electrons are called hot carrier. Such accelerated electrons (hot carrier) strike against a crystal of silicon in the drain region 3, therefore, the electrons shifted a direction of movement. As the result, a part of electrons which change their path to the floating gate 5 run over an energy barrier of silicon oxide film by the effect of a vertical electrical field which is induced in a direction from the control gate 7 to floating gate due to a capacitor coupling, and then the electrons are injected into the floating gate 5. The memory cell is programmed by a drain side injection of hot carrier as described above.

Electrons which struck against the silicon atoms have probability of being rebound in any direction from the impact place due to the impact ionization effect. However, since only the electrons which are rebounded to the floating gate 5, that is, in the vertical direction are injected into the floating gate 5, the efficiency of the program is lowered.

SUMMARY OF THE INVENTION

Therefore, an object of the invention is to provide a memory cell array which can improve program efficiency by increasing the rate of generation of hot carriers.

To achieve this object, an active region of the memory cell array according to the present invention has first portion and fifth portion which are both ends thereof and a third portion which is the middle portion thereof. The first, third and fifth portions maintain parallel state from each other having a certain spacing. The first and third portion are interconnected by a second portion sloped toward from a side of the third portion. The third portion and fifth portion are interconnected by a fourth portion sloped upward from other side of the third portion.

Source regions are formed in the first portion and fifth portion of the active region. A drain region is formed in the third portion of the active region. Channel regions are formed in the second portion and fourth portion of the active region. Floating gates disposed over each of the channel region. A pair of control gates disposed over the floating gates.

DESCRIPTION OF THE DRAWINGS

Other objects and advantages of the present invention will be understood by reading the detailed explanation of the embodiment with reference to the accompanying drawings in which:

FIG. 3 is a lay-out to illustrate a memory cell array according to the present invention;

DETAILED DESCRIPTION OF THE DRAWINGS

Figure 1:
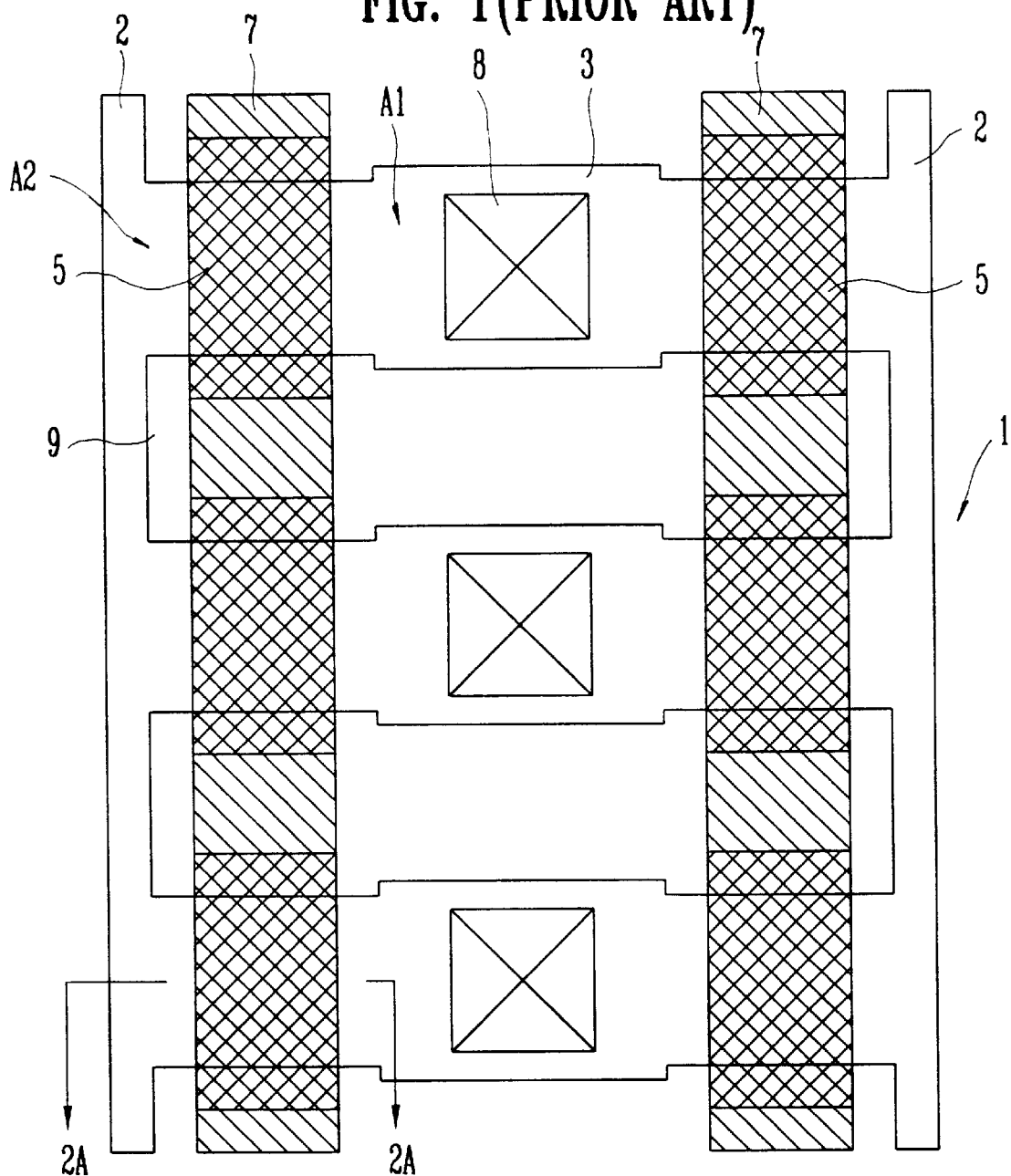
FIG. 1 is a lay-out to illustrate a conventional memory cell array.
Figure 2:
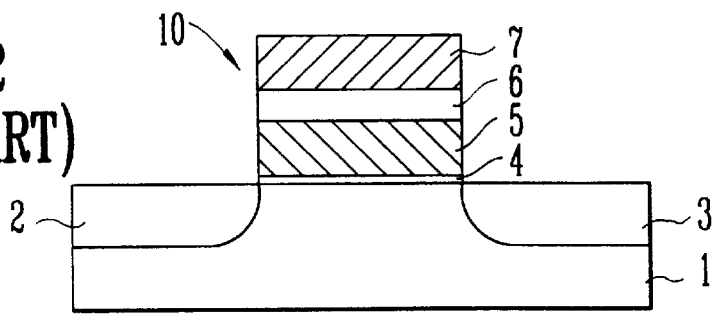
FIG. 2 is a sectional view taken along the line 2A—2A of FIG. 1.

A detailed description of the present invention is given below with reference to the accompanying drawings.

FIG. 3 is a lay-out to illustrate a memory cell array according to the present invention. Hereinafter, only one row of the memory cell array will be described below as an example.

A field oxide film 20 is formed in selected portion of a silicon substrate 11. The field oxide film 20 is divided into a first portion 21, fifth portion 25 which are both ends thereof, and a third portion 23 which is a middle portion. As shown in FIG. 3, the first, third and fifth portions 21, 23 and 25 of the field oxide film 20 are not formed in a line but formed in a parallel state having a certain spacing. That is, the third portion 23 is formed at a position spaced forward (with reference to FIG. 3) from the first portion 21, the fifth portion 25 is formed at a position spaced forward (with reference to FIG. 3) from the third portion 23. The first portion 21 and third portion 23 are connected by means of a second portion 22, and the third portion 23 and fifth portion 25 are connected by means of a fourth portion 24. As shown in FIG. 3, the second portion 22 connecting the first portion 21 and third portion 23 and the fourth portion 24 connecting the third portion 23 and fifth portion 25 have rhombus shape respectively, due to arrangement of the first, third and fifth portions 21, 23 and 25. Every field oxide films 20 are constituted in the same way on the silicon substrate 11.

As a result, an active region A existing between the field oxide films 20 has the same shape as the field oxide film 20. That is, the active region A is divided into a first portion A1 and a fifth portion A5 which are both ends thereof, and a third portion A3 which is a middle portion. As shown in FIG. 3, the first, third and fifth portions A1, A3 and A5 of the active region A are not formed in a line but formed in a parallel state having a certain spacing. That is, the third portion A3 is formed at a position spaced forward (with reference to FIG. 3) from the first portion A1, the fifth portion AS is formed at a position spaced forward (with reference to FIG. 3) from the third portion A3. The first portion A1 and third portion A3 are connected by means of a second portion A2, and the third portion A3 and fifth portion AS are connected by means of a fourth portion A4. As shown in FIG. 3, the second portion A2 connecting the first portion A1 and third portion A3, the fourth portion A4 connecting the third portion A3 and fifth portion AS have rhombus shape respectively, due to arrangement of the first, third and fifth portions A1, A3 and AS. Every active regions A have a same shape.

On the other hand, floating gates 15 are disposed over the second and fourth portions A2 and A4 of the active region A respectively, each floating gate 15 includes portions of second and fourth portions 22 or 24 of the field oxide films 20. Control gates 17 crossing the field oxide films 20 are disposed over the floating gates 15. Source regions 12 are formed in selected portions (that is, the first portion A1 and fifth portion A5) of the active region A, respectively. A drain region 13 is formed in selected portion (that is, third portion A3) of the active region A. A contact portion 18 for contact with a bit line is formed at the drain region 13.

Now, each portion of the memory cell constructing the memory cell array will be described with reference to FIGS. 4A, 4B and 4C to help in understanding the present invention.

Figure 4A:
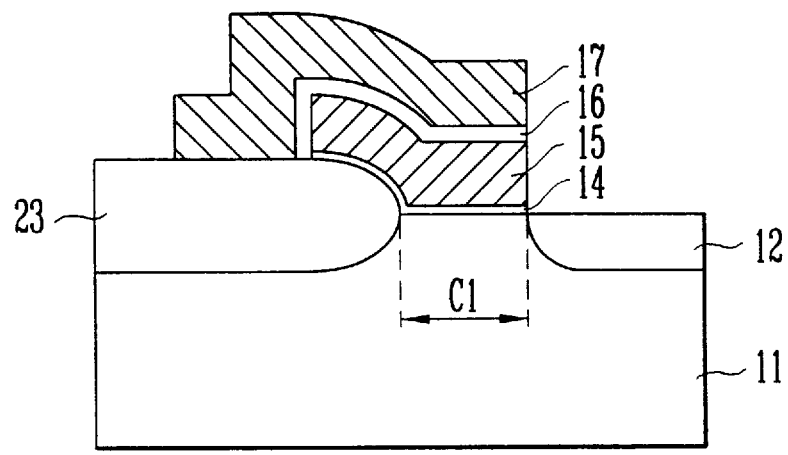
FIG. 4A is a sectional view taken along the line 4A—4A of FIG. 3.

FIG. 4A is a sectional view taken along the line 4A—4A of FIG. 3. The field oxide film 20 and source region 12 formed in the silicon substrata 11 are spaced by a first channel region C1. A tunnel oxide film 14 and the floating gate 15 are formed in stack on a portion of silicon substrate 11 including the first channel C1 and a portion of the third portion 23 of the field oxide film (20 of FIG. 3). A dielectric film 16 is formed on top and side of the floating gate 15, and the control gate 17 is formed on the dielectric film 16 and a portion of the third portion 23 of the field oxide film (20 of FIG. 3).

Figure 4B:
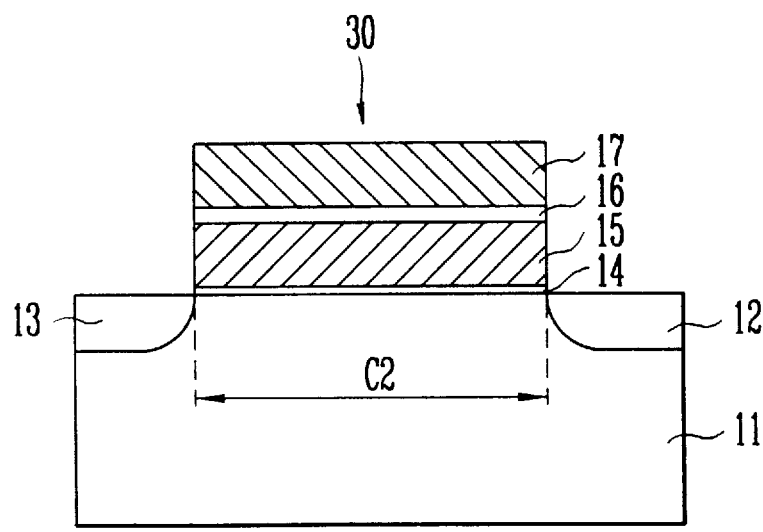
FIG. 4B is a sectional view taken along the line 4B—4B of FIG. 3.

FIG. 4B is a sectional view taken along the line 4B—4B of FIG. 3. A gate electrode 30 which is formed with the tunnel oxide film 14, floating gate 15 dielectric film 16 and control gate 17 in stack structure is formed on a second channel region C2 of the silicon substrate 11. The source and drain regions 12 and 13 are formed in the silicon substrate 11 corresponding to both side ends of the gate electrode 30.

Figure 4C:
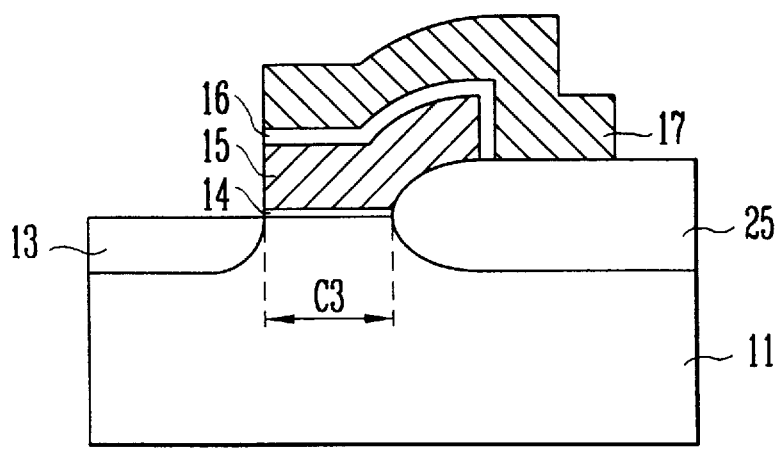
FIG. 4C is a sectional view taken along the line 4C—4C of FIG. 3.

FIG. 4C is a sectional view taken along the line 4C—4C of FIG. 3. The field oxide film 20 and drain region 13 formed in the silicon substrata 11 are spaced by a third channel region C3. The tunnel oxide film 14 and the floating gate 15 are formed in stack on a portion of silicon substrate 11 including the third channel C3 and a portion of the fifth portion 25 of the field oxide film (20 of FIG. 3). The dielectric film 16 is formed on top and side of the floating gate 15, and the control gate 17 is formed on the dielectric film 16 and a portion of the fifth portion 25 of the field oxide film (20 of FIG. 3).

Now, the program operation of the memory cell array will be described below.

If program bias voltages are applied to the control gate 17, drain region 13 and source region 12, a horizontal electric field is formed in the first, second and third channel regions C1, C2 and C3. At this time, in case where the length of the second channel region C2 shown in FIG. 4B is same as that of the conventional memory cell, the lengths of the first and third channel regions C1 and C3 become shorter than that of the second channel C2. However, since the width of the second channel region C2 shown in FIG. 4B is formed to be narrower than that of the channel region of the conventional memory due to the rhombus shape of the floating gate 15 as shown in FIG. 3, the concentration of the electric field is occurred at the second channel region C2. Therefore, the rate of generation of hot carriers is increased at the second channel region C2, and the probability that hot carriers are injected into the floating gate 15 is increased thereby improving the program efficiency. In addition, the program operational speed is increased thereby improving the operational characteristics of the device.

As described above, the floating gate is formed with rhombus shape thereby decreasing the width of the channel region so the rate of generation of hot carriers is increased and the program efficiency can be improved. Consequently, the nonvolatile memory device having the high speed of operation can be implemented.

What is claimed is:

1. A memory cell array having improved channel characteristics comprising:

an active region defined by a field oxide film formed in a silicon substrate, said active region having a first portion and a fifth portion at respective ends thereof and a third portion in a middle portion thereof, said first, third and fifth portions being parallel state to one another and having a certain spacing, said first and third portions being interconnected by a second portion sloped toward a first side of said third portion, said third portion and fifth portions being interconnected by a fourth portion sloped upward from another side of said third portion;

source regions formed in said silicon substrate at said first portion and fifth portions of said active region;

a drain region formed in said silicon substrate at said third portion of said active region;

channel regions formed in said silicon substrate at said second portion and fourth portions of said active region;

floating gates disposed over each of said channel region; and a pair of control gates disposed over said floating gates, each said control gate extended to cross said oxide film.

* * * * *